United States Patent
Shim

(10) Patent No.: US 7,326,645 B2
(45) Date of Patent: Feb. 5, 2008

(54) METHODS FOR FORMING COPPER INTERCONNECT OF SEMICONDUCTOR DEVICES

(75) Inventor: Joon Bum Shim, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,533

(22) Filed: Dec. 30, 2004

(65) Prior Publication Data

US 2005/0142864 A1    Jun. 30, 2005

(30) Foreign Application Priority Data

Dec. 31, 2003   (KR)   .................. 10-2003-0101322

(51) Int. Cl.
*H01L 31/4763*   (2006.01)
(52) U.S. Cl. .................. 438/634; 438/638; 438/639; 438/640
(58) Field of Classification Search ............... 438/634, 438/638–640

See application file for complete search history.

(56) References Cited

U.S. PATENT DOCUMENTS

| | | | |
|---|---|---|---|
| 6,121,141 A | 9/2000 | Woo et al. ................ 438/687 |
| 6,399,483 B1 * | 6/2002 | Liu et al. .................. 438/638 |
| 6,417,566 B1 | 7/2002 | Wang et al. .............. 257/750 |
| 6,440,838 B1 * | 8/2002 | Lui et al. .................. 438/618 |
| 6,593,246 B1 * | 7/2003 | Hasegawa et al. ........ 438/736 |
| 6,660,630 B1 * | 12/2003 | Chang et al. ............. 438/637 |
| 2004/0192058 A1 * | 9/2004 | Chu et al. ................. 438/710 |

FOREIGN PATENT DOCUMENTS

KR   10-2002-0009381   2/2002

* cited by examiner

*Primary Examiner*—Hsien-Ming Lee
(74) *Attorney, Agent, or Firm*—Saliwanchik, Lloyd & Saliwanchik

(57) ABSTRACT

Methods for forming a copper interconnect of a semiconductor device are disclosed. A disclosed method comprises forming a lower metal interconnect; sequentially depositing a capping layer, a first insulating layer, and a second insulating layer on the lower metal interconnect; forming a via hole by etching the first insulating layer and the second insulating layer; forming a trench and terraces by etching the second insulating layer; and exposing at least a portion of the top surface of the lower metal interconnect by etching the capping layer.

18 Claims, 2 Drawing Sheets

METHODS FOR FORMING COPPER INTERCONNECT OF SEMICONDUCTOR DEVICES

FIELD OF THE DISCLOSURE

The present disclosure relates generally to semiconductor devices and, more particularly, to methods for forming a copper interconnect of a semiconductor device using a dual damascene process.

BACKGROUND

Since efforts to improve a copper etching method have proven unsuccessful, a copper dual damascene process, which inlays copper in an interconnect line, has been developed as an alternative. The copper dual damascene process has been verified as an excellent process in terms of process affinity and cost reduction; although it had been confronted with practical barriers in terms of manufacturing apparatus due to completely different structures and across-the-board changes.

FIGS. 1a through 1c are cross-sectional views illustrating a conventional process of forming a copper interconnect of dual damascene structure of a semiconductor device. Referring to FIG. 1a, a lower metal interconnect 11 is formed through an insulating layer on a substrate (not shown) having at least one structure. A capping layer 12 is deposited on the substrate including on the lower metal interconnect 11. The capping layer 12 is made of silicon nitride. A first insulating layer 13 is then deposited on the capping layer 12. The first insulating layer 13 is made of fluorinated silica glass (FSG) with a low dielectric constant. An etch-stop layer 14 is formed on the first insulating layer 13. The etch-stop layer 14 is made of silicon nitride. A second insulating layer 15 is then deposited on the etch-stop layer 14.

Referring to FIG. 1b, a via hole 16 is formed through the first insulating layer 13 by photolithographic and etching processes. The photoresist pattern for forming the via hole 16 is then removed. Next, by performing another photolithography process and another etching process using the etch-stop layer 14 as a mask, a trench 17 for an upper metal interconnect is formed through the second insulating layer 15.

Referring to FIG. 1c, some portion of the capping layer 12 is removed by using a dry etching process to form an opening 18 on the lower metal interconnect 11. The trench 17, the via hole 16, and the opening 18 are then filled with copper to complete a dual damascene interconnect connected to the lower metal interconnect 11.

In the above-described conventional process of forming a copper interconnect having a dual damascene structure, the via hole 16 is formed by sequentially dry-etching the second insulating layer 15, the etch-stop layer 14 and the first insulating layer 13. Therefore, a size difference between the upper part and the lower part of the etch-stop layer 14 is caused due to the etching selectivity between the etch-stop layer 14 and the second insulating layer 15. Such a size difference may cause void formation in a copper via line when the via hole 16 and the trench 17 are filled with copper by a copper plating process. Furthermore, although the etching rate to the etch-stop layer 14 has been made substantially equal to the etching rate to the second insulating layer 15 by improving the dry etching process, overhang may occur when a barrier metal layer of Ta/TaN and a copper seed layer are deposited in the trench 17 and the via hole 16 because the width of the trench 17 is larger than the width of the via hole 16. This overhang may cause void formation in a copper via line, thereby deteriorating the device characteristics.

DETAILED DESCRIPTION

Figure 1A:
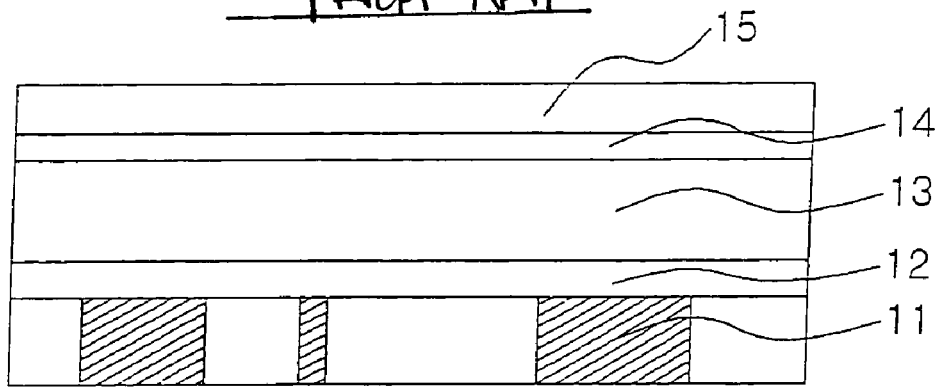
FIGS. 1a through 1c are cross-sectional views illustrating a conventional process of fabricating a copper interconnect having a dual damascene structure.
Figure 1B:
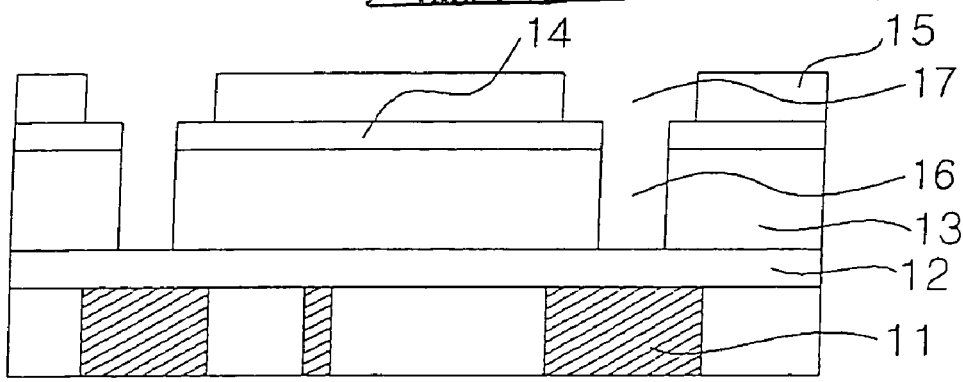
Figure 1C:
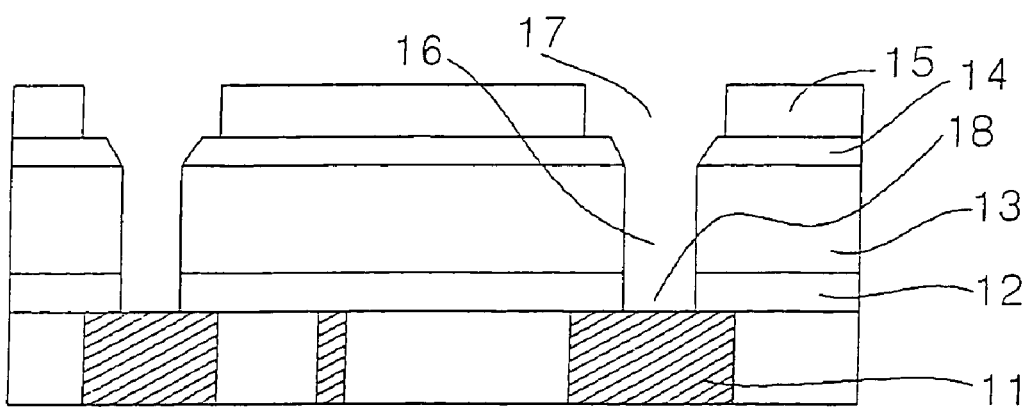
Figure 2A:
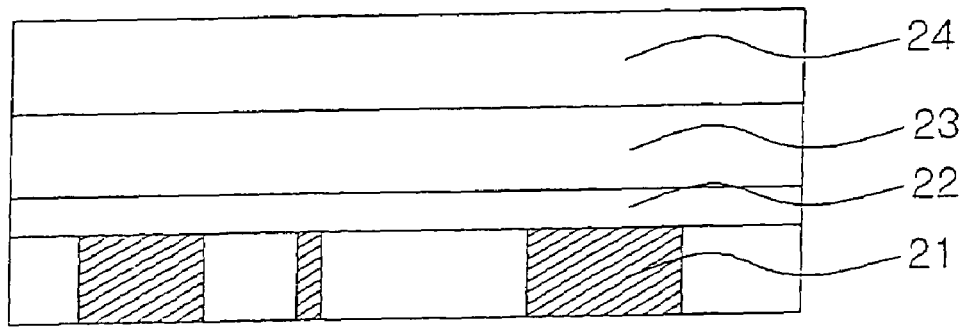
FIGS. 2a through 2c are cross-sectional views illustrating an example process of fabricating a copper interconnect having dual damascene structure performed in accordance with the teachings of the present invention.
Figure 2B:
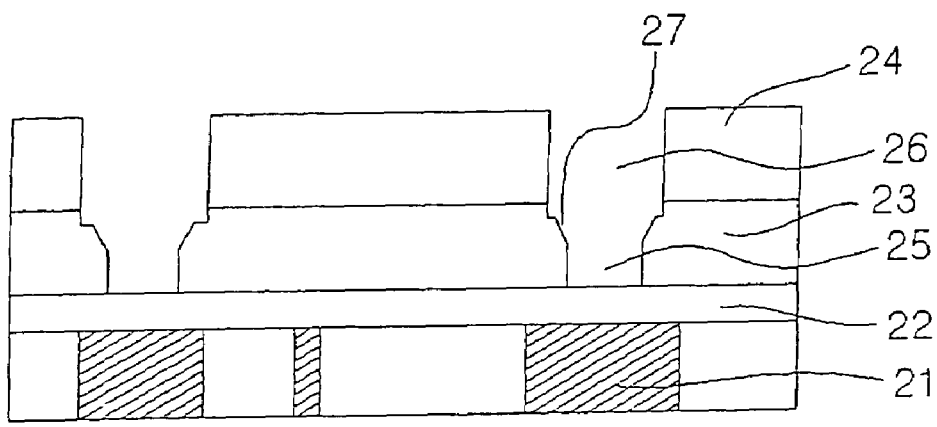
Figure 2C:
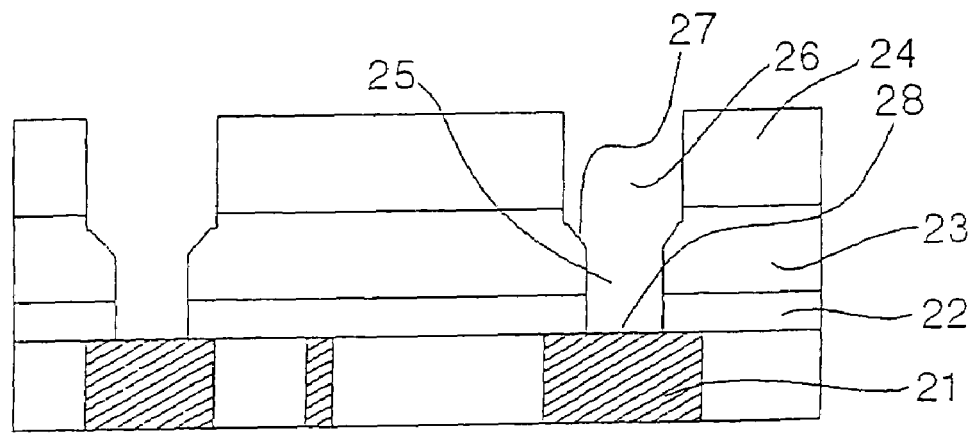

FIGS. 2a through 2c are cross-sectional views illustrating an example process of fabricating a copper interconnect for a semiconductor device. The interconnect of the illustrated example has a dual damascene structure.

Referring to FIG. 2a, a lower metal interconnect 21 is formed through an insulating layer on a substrate (not shown) having at least one active or passive structure (e.g., a transistor or resistor). A capping layer 22 is deposited on the substrate including the lower metal interconnect 21. The capping layer 22 prevents materials contained in an insulating layer to be formed by a later process (e.g., fluorine (F) or phosphorus (P)) from being diffused into the lower metal interconnect 21. In the illustrated example, the capping layer 22 is preferably made of silicon nitride and has a thickness between about 200 Å and about 400 Å. A first insulating layer 23 is then deposited on the capping layer 22. In the illustrated example, the first insulating layer 23 is preferably made of FSG which has a low dielectric constant and has a thickness between about 7000 Å and about 10000 Å. A second insulating layer 24 is then deposited on the first insulating layer 23. In the illustrated example, the second insulating layer 24 is preferably made of phospho-silicate glass (PSG), and, thus, differs from the first insulating layer 23.

Referring to FIG. 2b, a photoresist pattern (not shown) is formed on the second insulating layer 24 by a photolithography process. A first dry etching process is then performed while using the photoresist pattern as a mask to remove some portion(s) of the second insulating layer 24 and the first insulating layer 23. The photoresist pattern is then removed by an ashing process to complete a via hole 25 through the first insulating layer 23. The illustrated example process does not use an etch-stop layer. In other words, the second insulating layer 24 is directly deposited on the first insulating layer 23 without the deposition of an etch-stop layer on the first insulating layer 23. Therefore, the illustrated example process overcomes the size difference between the upper part and the lower part of the via hole which is present in the conventional process described above due to an etching selectivity between the etch-stop layer and the insulating layers.

Next, a bottom antireflection coating (BARC) (not shown) is deposited on the resulting structure. The BARC completely fills the via hole 25. A photoresist pattern (not shown) is formed on the BARC by a photolithography process. A second dry etching process is then performed while using the photoresist pattern as a mask to remove some portion(s) of the second insulating layer 24. The photoresist pattern and the BARC are then removed by an ashing process to complete a trench 26 through the second insulating layer 24. In the illustrated example, the trench 26 preferably has a depth between about 3000 Å and about 5000 Å. By performing the second dry etching process, both edge portions of the upper part of the via hole 25 are removed to form terraces 27.

In the illustrated example, the second dry etching process is performed by an etching apparatus using a dual plasma source. The etching apparatus of the illustrated example uses a source power between about 1000 W and about 1500 W, and a bias power between about 500 W and about 1000 W. In this example, the etching chamber has a volume between about 30 L and 40 L, and the internal pressure of the etching chamber is between about 20 mTorr and about 100 mTorr.

In the illustrated example. the second dry etching process uses $CHF_3$, $CF_4$, Ar and $O_2$ as etching gases. The $CHF_3$ gas of this example is supplied at a rate between about 20 sccm (standard cubic centimeter per minute) and about 50 sccm, and the $CF_4$ gas is supplied at a rate between about 50 sccm and 100 sccm. Further, the Ar gas is supplied at a rate between about 100 sccm and about 400 sccm, and the $O_2$ gas is supplied at a rate between about 5 sccm and about 15 sccm.

In the illustrated example, the depth of the trench 26 formed by the second dry etching process has a uniformity of about 3%.

Further, the illustrated example terraces 27 are formed so that the inclined plane of each terrace 27 is at an angle between about 60° and about 80° from the contact surface between the trench 26 and the via hole 25. By forming the terraces 27, the illustrated example process achieves a metal interconnect having a substantially uniform thickness even though an etch-stop layer is not deposited on the first insulating layer 23. Furthermore, by altering the right-angled edges between the via hole 25 and the trench 26 into the terraces 27, the example process obviates overhang which may occur during later Ta/TaN and copper deposition processes.

Referring to FIG. 2c, some portion(s) of the capping layer 22 are removed by a third dry etching process to form an opening 28 on the lower metal interconnect 21. The opening 28 exposes at least a portion of the top surface of the lower metal interconnect 21. Because the third dry etching process is performed without an etch-stop layer, the exposed portion(s) of the terraces formed by the second etching process are removed to form a complete terrace structure. In other words, both upper edges of the via hole 25 are etched more rapidly than the lower part of the trench 26 due to the intrinsic property of the etchant and, therefore, the terrace structure becomes more apparent.

In the illustrated example, the third dry etching process for making the opening 28 is performed by an etching apparatus using a dual plasma source. In such an example, the etching apparatus uses a source power between about 1500 W and about 2000 W, and a bias power between about 1000 W and about 1500 W. In the illustrated example, the etching chamber has a volume between about 25 L and about 30 L, and the internal pressure of the etching chamber is between about 20 mTorr and about 40 mTorr. The third dry etching process of the illustrated example uses $CHF_3$, $CF_4$, and Ar as etching gases. In the illustrated example, the $CHF_3$ gas is supplied at a rate between about 20 sccm and about 30 sccm, the $CF_4$ gas is supplied at a rate between about 10 sccm and about 200 sccm, and the Ar gas is supplied at a rate between about 200 sccm and about 300 sccm. The etching selectivity of the capping layer to the insulating layers is preferably less than 1 to 0.7. The inclined plane of each of the illustrated terraces 27, which are formed by the third dry etching process, is preferably at an angle between about 60° and about 70° from the contact surface between the trench 26 and the via hole 25.

From the foregoing, persons of ordinary skill in the art will appreciate that the above-described methods of forming a copper interconnect of a semiconductor device prevent void formation in the copper interconnect by etching insulating layers without using an etch-stop layer, thereby improving the electrical characteristics of the copper interconnect. Moreover, the described methods form terraces in the upper part of a via hole by removing the right-angled edges of the via hole, thereby enhancing the reliability of a dual damascene copper interconnection.

It is noted that this patent claims priority from Korean Patent Application Serial Number 10-2003-0101322, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a copper interconnect for a semiconductor device comprising:
   forming a lower metal interconnect;
   sequentially depositing a capping layer, a first insulating layer, and a second insulating layer over the lower metal interconnect, wherein the second insulating layer is deposited on the first insulating layer directly after depositing the first insulating layer, and wherein the second insulating layer is neither an antireflecting layer nor an etch stop layer;
   etching the first insulating layer and the second insulating layer to form a via hole;
   etching the second insulating layer to form a trench;
   forming terraces by removing edge portions of the upper part of the via hole; and
   etching the capping layer to expose at least a portion of a top surface of the lower metal interconnect.

2. The method as defined by claim 1, wherein the capping layer comprises silicon nitride and has a thickness between about 200 Å and about 400 Å.

3. The method as defined by claim 1, wherein the first insulating layer comprises fluorinated silica glass (FSG) having a low dielectric constant and a thickness between about 7000 Å and about 10000 Å.

4. The method as defined by claim 1, wherein the second insulating layer comprises phospho-silicate glass (PSG).

5. The method as defined by claim 1, wherein etching the second insulating layer to form the trench and forming the terraces are performed by an etching apparatus using a dual plasma source.

6. The method as defined by claim 5, wherein the etching apparatus is operated with a source power between about 1000 W and about 1500 W, a bias power between about 500 W and about 1000 W, an etching chamber internal pressure between about 20 mTorr and about 100 mTorr, and an etching chamber volume between about 30 L and about 45 L.

7. The method as defined by claim 5, wherein etching the second insulating layer to form the trench comprises using $CHF_3$ at a rate between about 20 sccm and about 50 sccm, $CF_4$ at a rate between about 50 sccm and about 100 sccm, Ar at a rate between about 100 sccm and 400 sccm, and $O_2$ at a rate between about 5 sccm and 15 sccm, as etching gases.

8. The method as defined by claim 1, wherein at least one of the terraces has an inclined plane oriented at an angle between about 60° and about 80° from a contact surface between the trench and the via hole, wherein the contact surface is perpendicular to a top surface of the first insulating layer.

9. The method as defined by claim 1, wherein etching the capping layer is performed by an etching apparatus using a dual plasma source.

10. The method as defined by claim 9, wherein the etching apparatus is operated with a source power between about 1500 W and about 2000 W, a bias power between about 1000 W and about 1500 W, an etching chamber internal pressure between about 20 mTorr and about 40 mTorr, and an etching chamber volume between about 20 L and about 30 L.

11. The method as defined by claim 9, wherein etching the capping layer comprises using $CHF_3$ at a rate between about 20 sccm and about 30 sccm, $CF_4$ at a rate between about 10 sccm and about 200 sccm, and Ar at a rate between about 200 sccm and 300 sccm, as etching gases.

12. The method as defined by claim 1, further comprising depositing a bottom antireflection coating to fill the via hole after etching the first insulating layer and the second insulating layer to form the via hole.

13. The method as defined by claim 12, further comprising selectively removing a portion of the bottom antireflection coating after forming the terraces.

14. The method as defined by claim 1, wherein the trench has a depth between about 3000 Å and about 5000 Å.

15. The method as defined by claim 1, wherein the trench has a depth having a uniformity of about 30%.

16. The method as defined by claim 1, wherein etching the capping layer is performed without an etch-stop layer, and wherein etching the capping layer removes an exposed portion of the terraces to form complete terrace structure.

17. The method as defined by claim 1, wherein etching the capping layer forms an inclined plane for the terraces of an angle between about 60° and about 70° from a contact surface between the trench and the via hole, wherein the contact surface is perpendicular to a top surface of the first insulating layer.

18. The method as defined by claim 1, wherein an etching selectivity of the capping layer to the first and second insulating layers is less than 1 to 0.7.

* * * * *